United States Patent
Roth

(10) Patent No.: US 6,614,315 B2
(45) Date of Patent: Sep. 2, 2003

(54) TUNING CIRCUIT FOR A YIG OSCILLATOR

(75) Inventor: Alexander Roth, Dorfen (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 09/878,395

(22) Filed: Jun. 12, 2001

(65) Prior Publication Data

US 2002/0005762 A1 Jan. 17, 2002

(30) Foreign Application Priority Data

Jul. 14, 2000 (DE) .......................... 100 34 325

(51) Int. Cl.[7] ................................. H03L 7/00
(52) U.S. Cl. ..................... 331/10; 331/14; 331/16; 331/25
(58) Field of Search ............... 331/10, 11, 14, 331/16, 18, 17, 25, DIG. 2

(56) References Cited

U.S. PATENT DOCUMENTS 5,410,277 A * 4/1995 Asao et al. ................. 331/10
6,118,345 A * 9/2000 Scheffold ................... 327/156

FOREIGN PATENT DOCUMENTS

| DE | A1-19701306 | 7/1998 |
| DE | A1-19716776 | 10/1998 |
| JP | A62132426 | 6/1987 |

OTHER PUBLICATIONS

Astrof, Frequency Synthesis in a Mircorwave Signal Generator, pp. 8–15.

* cited by examiner

Primary Examiner—Terry D. Cunningham
Assistant Examiner—Quan Tra
(74) Attorney, Agent, or Firm—Birch, Stewart, Kolasch & Birch, LLP

(57) ABSTRACT

In the case of a tuning circuit for a YIG oscillator, wherein the output frequency of the YIG oscillator which is reduced by a frequency divider or mixer is compared in a phase detector with a lower reference frequency and via a loop filter the output voltage of the phase detector feeds the air-cored coil of the YIG oscillator serving for fine tuning, the main coil of the YIG oscillator is also fed by the output voltage of the phase detector.

4 Claims, 3 Drawing Sheets

TUNING CIRCUIT FOR A YIG OSCILLATOR

This nonprovisional application claims priority under 35 U.S.C §119(a) on Patent Application No. 100 34 325.2 filed in Germany on Jul. 14, 2000, which is herein incorporated by reference.

BACKGROUND OF INVENTION

1. Field of Invention

The invention relates to a tuning circuit according to the preamble to the main claim.

2. Description of the Background Art

Tuning circuits of this type for YIG oscillators are known (book by U. Rohde, "Microwave and Wireless Synthesizers", page 402 ff, spectrum analyzers FSA and FSE manufactured by Rohde & Schwarz). YIG oscillators are used as oscillators which are capable of being tuned over a wide frequency range of, for example, 4 to 12 GHz and which are synchronized via an appropriate phase-control loop to a lower reference frequency which, for example, is prespecified by a synthesizer. At the same time, great demands are made of the phase jitter of the YIG oscillator outside the controlled bandwidth; in addition, the tuning-rate and the transient oscillation in the event of large jumps in frequency are to be, as far as possible, of the same order of magnitude as in the case with conventional voltage-controlled oscillators capable of being tuned via variable-capacitance diodes.

SUMMARY OF THE INVENTION

Tuning of the oscillation frequency is effected in the case of a YIG oscillator by means of a magnetic field, whereby relatively high magnetic field strengths are required. The greater part of this field strength is generated by a main coil with iron core; fine tuning is effected with the aid of a smaller air-cored coil (also called an FM coil). By virtue of the large inductance of the main coil in conjunction with the associated stray capacitances, a YIG oscillator can be tracked via the main coil only in the narrow band. For bandwidths greater than 100 kHz, closed-loop control is effected via the air-cored coil, the capture range of which is limited by the constructional features of the YIG oscillator to about 50 MHz. In the case of a known tuning circuit for a YIG oscillator the main coil is fed with a pretuning current which is generated from the desired output frequency of the YIG oscillator which is digitally prespecified in a processor via a digital/analogue converter and an appropriately controllable current source. Synchronization is effected separately thereof via the air-cored coil as a function of the output voltage of the phase detector. A disadvantage of this known arrangement is the noise current produced by the current source of the main coil, by virtue of which the YIG oscillator is modulated with strong phase jitter outside the controlled bandwidth. With a view to improving the phase jitter, it is in fact known to connect another capacitor in parallel with the main coil, which together with the main coil forms a resonating circuit, as a result of which, however, the frequency-setting rate is reduced in the event of large jumps in frequency. Accordingly, a rapid change of frequency is only possible without a capacitor, but then the phase jitter is again inadmissibly bad.

It is therefore an object of the present invention to provide a turning circuit for a YIG oscillator, wherein despite little circuit complexity the phase jitter is low and the turning-rate is high.

This object is achieved, starting from a tuning circuit according to the preamble to the main claim, by virtue of the characterising features thereof. Advantageous further developments are evident from the subordinate claims.

According to the invention the main coil of the YIG oscillator is also fed directly by the output voltage of the phase detector. The current through the main coil results from the applied voltage divided by the impedance of the main coil. Since the reactance rises with increasing frequency, this leads to low-pass behaviour. On account of this low-pass behaviour and on account of the low output impedance of the voltage source feeding the main coil, this circuit impresses only a negligible noise current. The tuning-rate is not restricted, since a capacitor located parallel to the main coil is superfluous. Transient phenomena are also avoided.

The d.c. resistance of the main coil is strongly temperature-dependent. The interrelationship between voltage and frequency is therefore very imprecise. Therefore according to a further development of the invention as specified in the dependent claims not only an additional pretuning voltage for the main coil is proposed but also an appropriate limitation of the maximal and minimal main-coil currents via the measurement of the drop in voltage arising at a series resistor of the main coil.

In contrast with the state of the art, the main coil is no longer fed from a current source but from a voltage source. It is a characteristic of a voltage source that the latter has a low output impedance of practically zero and consequently impresses only a negligible noise current upon the main coil.

The invention is elucidated in greater detail in the following on the basis of schematic drawings with reference to embodiment examples.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invent on will become more fully understood from the detailed description given hereinbelow and the accompanying drawings, which are give by way of illustration only, and thus are not limitive of the present invention, and wherein.

DETAILED DESCRIPTION OF THE PREFERRED EMBODIMENTS

Figure 1:
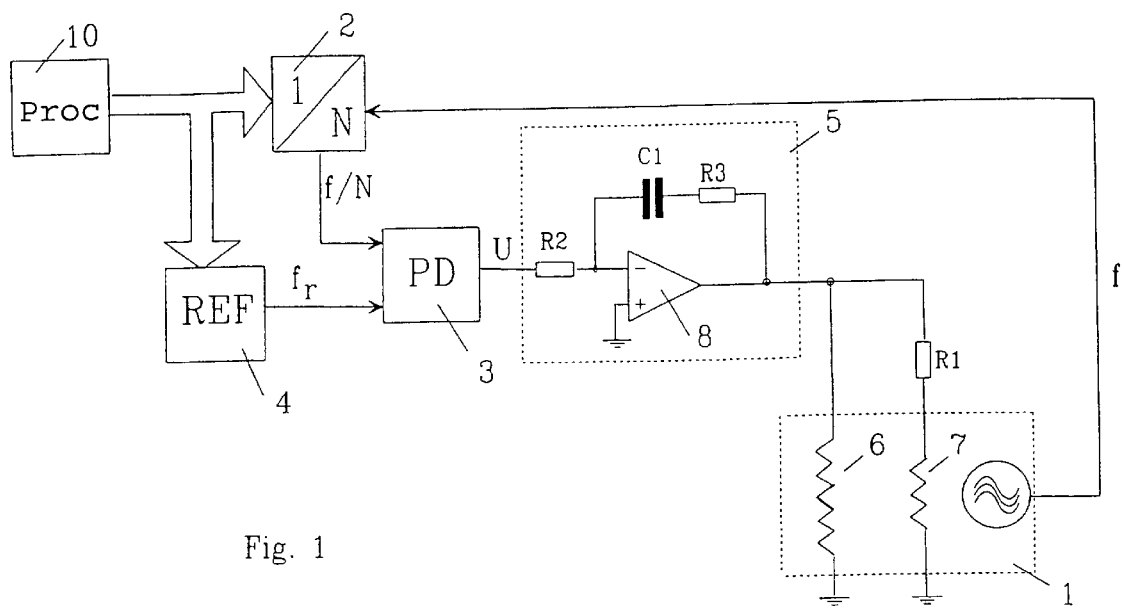
FIG. 1 is a schematic circuit diagram of a tuning circuit.

FIG. 1 shows the schematic circuit diagram of a tuning circuit according to the invention for a YIG oscillator 1, the output frequency f of which, capable of being set between 4 and 12 GHz for example, is reduced via a frequency divider or mixer 2 to a lower output frequency f/N which is compared in a phase detector 3 with the reference frequency $f_r$ of a reference oscillator 4, for example a frequency synthesizer. Setting of the desired output frequency f of the YIG oscillator is effected in a processor 10, via which the frequency divider 2 or the frequency mixer for reducing the output frequency and the reference oscillator 4 are also appropriately controlled, as indicated by the linkages. The output voltage U of the phase detector 3 corresponding to the phase error between the two frequency values f/N and $f_r$ is utilised via a loop filter 5 for feeding both the main coil 6 and the air-cored coil 7 of the YIG oscillator 1. The loop filter 5 consists in known manner of an operational amplifier 8 with a feedback circuit in the form of the series connection of a capacitor C1 and a resistor R3 as well as a dropping resistor R2. This loop filter 5 has low-pass character. The output voltage U of the phase detector 3 is supplied to the air-cored coil 7 via a resistor R1 and a predetermined control current is impressed upon said air-cored coil. At the same time the main coil 6 is fed directly via this output voltage U of the phase detector 3.

Figure 2:
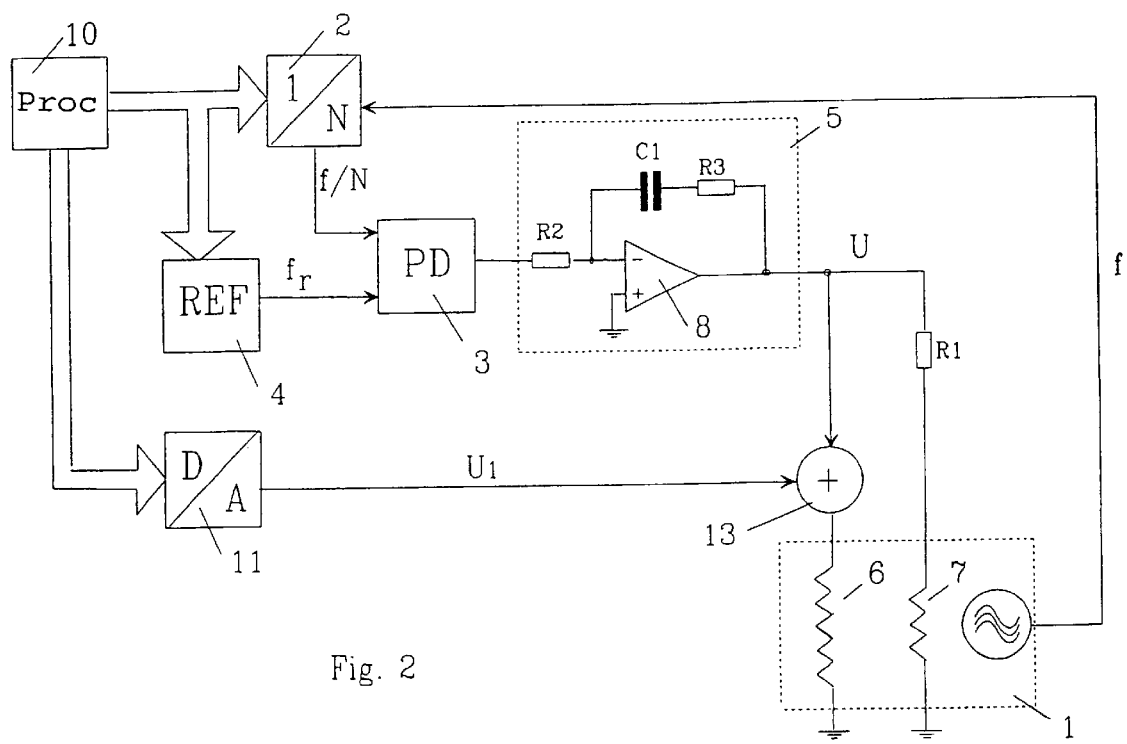
FIG. 2 is a schematic circuit diagram of a tuning circuit.

According to FIG. 2 the supply voltage for the main coil 6 can, in addition, also be preselected by a pretuning voltage U1 of a presetting circuit as a function of the set output frequency f. To this end, a digital presetting value for the YIG oscillator 1 is calculated from the output frequency f which has been set in the processor 10, said presetting value being converted via a digital/analogue converter 11 into a control voltage $U_1$ proportional thereto which via a voltage adder 13 is superimposed on the control voltage U of the phase detector 3. This adding circuit is dimensioned in such a way that the pretuning voltage $U_1$ predominates and mainly determines the current of the main coil 6, whereas the output voltage U of the phase detector 3 is correspondingly reduced and serves substantially only for fine tuning.

Figure 3:
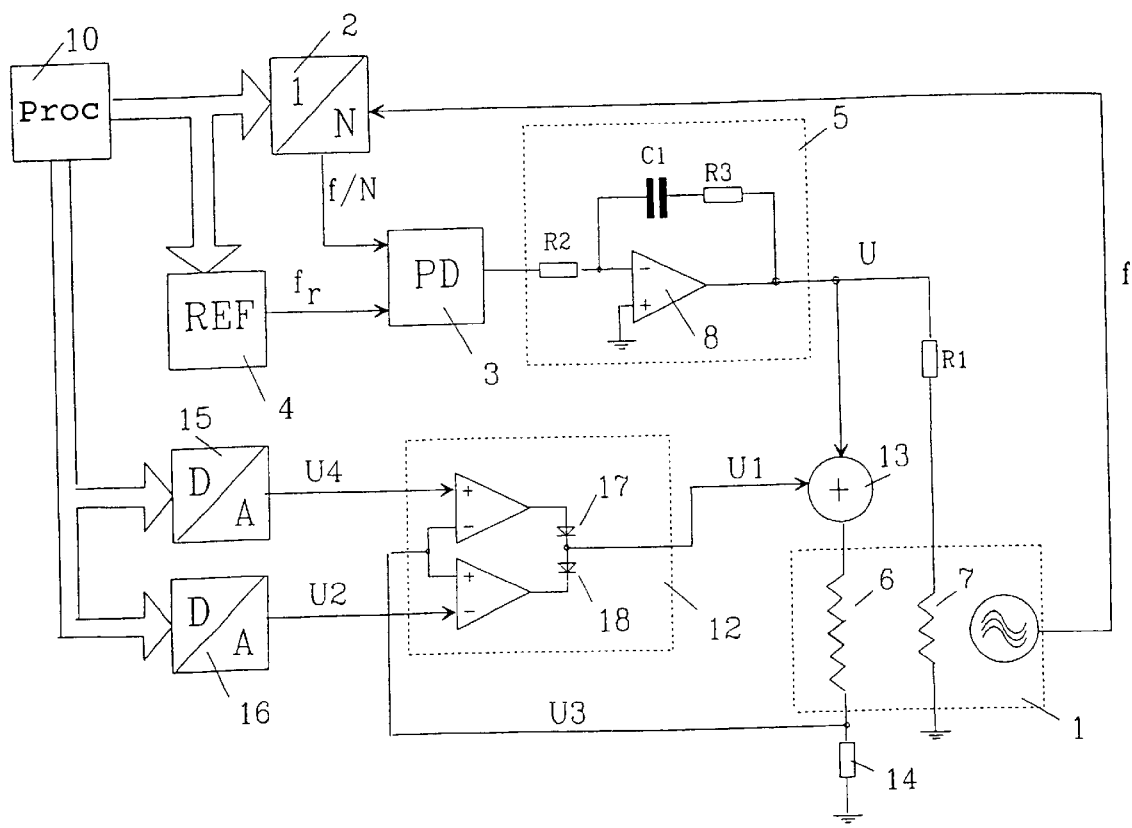
FIG. 3 is a schematic circuit diagram of a tuning circuit.

The d.c. resistance of the main coil 6 is strongly temperature-dependent, therefore the frequency cannot be inferred precisely from the voltage. Therefore according to the embodiment example as shown in FIG. 3 a temperature-resistant measuring resistor 14 is also connected in series with the main coil 6 and the voltage drop $U_3$ arising there is utilized as an additional control variable.

Figure 4:
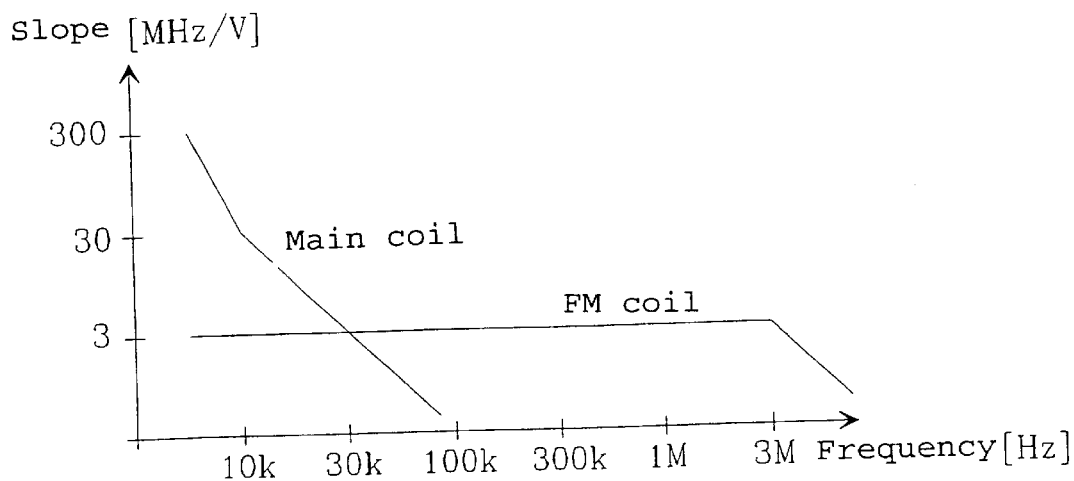
FIG. 4 is a graph representing the tuning slope.
Figure 5:
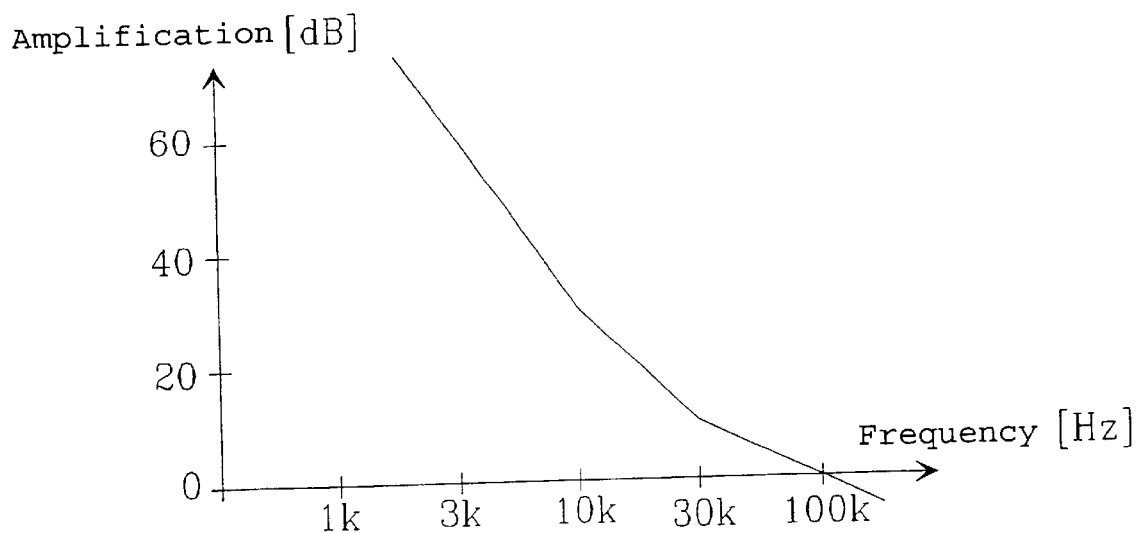
FIG. 5 is a graph of the loop gain.

Via this additional control variable the voltage at the main coil 6 of the YIG oscillator can be limited by means of a window comparator 12 upon reaching an upper limit or lower limit, so that the minimal current of the main coil 6 is not fallen below and the maximal current of the main coil 6 is not exceeded. To this end, from the output frequency f which has been prespecified in the processor 10 and which is to be set, taking account of the capture range of the YIG oscillator 1 (in the embodiment example the capture range is assumed to be ±50 MHz, that is to say 100 MHz altogether), in two D/A converters 15, 16 two separate pretuning voltages $U_4$ and $U_2$ are generated which are compared in the two operational amplifiers of the window comparator 12 with the voltage $U_3$ which drops at the resistor 14. If the upper limiting voltage $U_4$ exceeds the voltage $U_3$, then via the diode 17 a voltage $U_1$ is added to the regulating voltage U, so that $U_3$ is limited to the value of $U_4$. Corresponding remarks apply to the lower limit $U_2$: if the latter falls below the voltage $U_3$, then via a diode 18 the voltage U is likewise corrected appropriately. By this means it is guaranteed that the minimal current of the main coil is not fallen below and the maximal current of the main coil is not exceeded. In the case where use is made of a mixer 2 as a pretuning in the prespecified tuning range of the YIG oscillator, the two limiting voltages $U_4$ and $U_2$ can be pulled in. In the case where use is made of a frequency divider 2, via this arrangement the YIG oscillator is prevented from being interrupted in its oscillation as a result of too little tuning current or from oscillating above the maximum permitted output frequency. FIG. 4 shows the tuning slope of the two coils 6 and 7 of the YIG oscillator in the tuning circuit according to the invention; FIG. 5 shows the loop gain of the open loop. The main coil 6 has substantially low-pass characteristics; the air-cored coil 7 has a slope which is largely frequency-independent. In the embodiment example which is shown according to FIG. 4 the −3 dB point of this slope of the air-cored coil is situated at about 3 MHz. It has to lie far outside the controlled bandwidth, since otherwise the control circuit becomes unstable as a result of the phase rotation. FIG. 4 shows that the point of intersection between the two tuning rates of rise of main coil 6 and air-cored coil 7 lies at about 30 kHz. This point of intersection can be determined by the ratio of the resistances R2 and R3 of the loop filter 5. A greater amplification in the control circuit shifts the tuning characteristic of the main coil upwards and the point of intersection migrates towards higher frequencies. The frequency response of the drive of the main coil brings about a rise in the loop gain towards low frequencies, as generated in conventional control loops by the loop filter. Together with the time constant R3/C1 of the loop filter 5, this results in a third-order control loop.

FIG. 5 shows the loop gain of the open loop. The kink in the characteristic of the main coil at 10 kHz is due to the time constant R3/C1. Good control characteristics are obtained with the curve of the open loop that is represented. Hence the attenuation factor of the loop amounts to about 0.7. The control characteristics can be set by shifting the point of intersection between the tuning characteristics of main coil and air-cored coil.

What is claimed is:

1. A tuning circuit for a YIG oscillator, wherein an output frequency of the YIG oscillator, which is reduced by a frequency divider or a mixer, is compared in a phase detector with a lower reference frequency and via a loop filter, wherein an output voltage of the loop filter directly feeds an air-cored coil of the YIG oscillator serving for fine tuning, the output voltage being supplied to the loop filter directly from the phase detector, and wherein a main coil of the YIG oscillator is also fed, as a voltage, directly by the output voltage of the loop filter.

2. A tuning circuit for a YIG oscillator, wherein an output frequency of the YIG oscillator, which is reduced by a frequency divider or a mixer, is compared in a phase detector with a lower reference frequency and via a loop filter, wherein an output voltage of the phase detector feeds an air-cored coil of the YIG oscillator serving for fine tuning, wherein a main coil of the YIG oscillator is also fed by the output voltage of the phase detector, wherein a presetting circuit in which a coarse-tuning voltage, corresponding to the output frequency of the YIG oscillator, is generated from the output frequency of the YIG oscillator via a digital/analog converter, and wherein the coarse tuning voltage and the output voltage of the phase detector are added together and inputted to the main coil.

3. The tuning circuit according to claim 2, further comprising a temperature-resistant measuring resistor arranged in series with the main coil, wherein from the output frequency of the YIG oscillator and from upper and lower limiting values of a capture range of the YIG oscillator two appropriately different upper and lower coarse-tuning voltages are generated via digital/analog converters, which are each compared in a window comparator with the drop in voltage at the measuring resistor, so that the coarse-tuning voltage of the main coil is limited to these upper and lower limiting values corresponding to a minimal current and a maximal current, respectively, of the main coil.

4. The tuning circuit according to claim 2, wherein the output voltage of the phase detector, which is fed to the main coil of the YIG oscillator, functions as a voltage source with low output impedance.

* * * * *